United States Patent
Duval et al.

(10) Patent No.: US 6,678,932 B1
(45) Date of Patent: Jan. 20, 2004

(54) FIXTURE FOR ASSEMBLING PARTS OF A DEVICE SUCH AS A WIEN FILTER

(75) Inventors: Paul J. Duval, Lexington, MA (US); Vladimir Vayner, Needham, MA (US)

(73) Assignee: Schlumberger Technologies, Inc., San Jose, CA (US)

(*) Notice: Subject to any disclaimer, the term of this patent is extended or adjusted under 35 U.S.C. 154(b) by 197 days.

(21) Appl. No.: 10/011,007

(22) Filed: Nov. 8, 2001

(51) Int. Cl.⁷ ............................................. B25B 27/14
(52) U.S. Cl. ..................... 29/281.1; 350/529; 269/287; 269/16; 269/9
(58) Field of Search .................. 29/281.1; 250/396 ML; 335/210; 350/529, 248, 238, 239, 507, 532, 536; 269/16, 287, 9

(56) References Cited

U.S. PATENT DOCUMENTS 4,981,345 A * 1/1991 Berry et al. ................. 359/391
6,196,532 B1 * 3/2001 Otwell ........................ 269/21
6,517,063 B2 * 2/2003 Beyer ......................... 269/156
6,593,578 B1 * 7/2003 Duval et al. ......... 250/396 ML \* cited by examiner Primary Examiner—Joseph J. Hail, III
Assistant Examiner—Daniel Shanley
(74) Attorney, Agent, or Firm—Cohen, Pontani, Lieberman & Pavane

(57) ABSTRACT

In instruments such as Wien filters, electrostatic and/or magnetic pole pieces must be mounted on and secured to a supporting structure with a very high degree of dimensional precision, usually by brazing. To that end, a fixture is provided for holding the parts to be assembled in precise relationship and to press the pole pieces into engagement with the supporting structure while the securing operation is being carried out. The pressing is accomplished by a gravity-produced force which is, therefore, independent of positional accuracies caused by very high temperatures, such as are encountered during brazing.

11 Claims, 2 Drawing Sheets

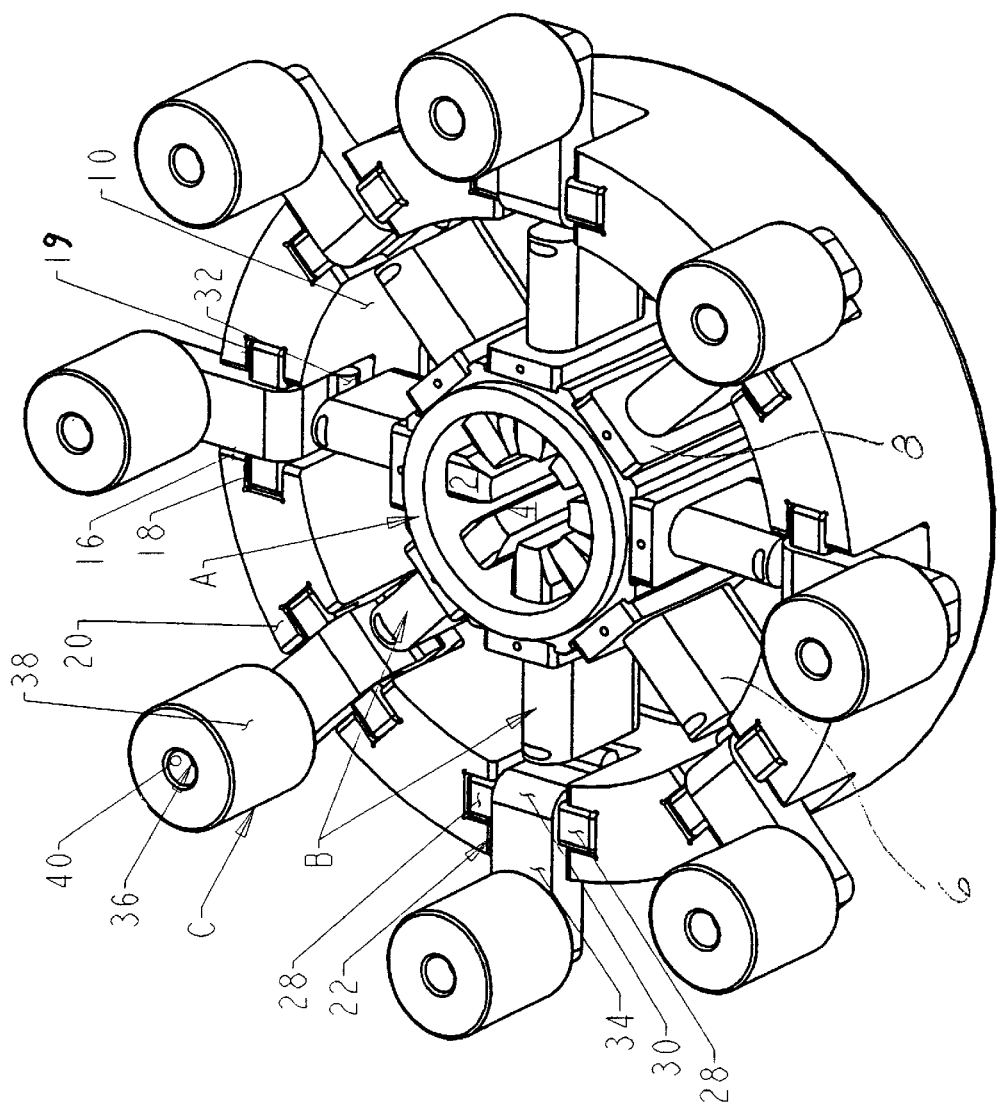
Fig_2

FIXTURE FOR ASSEMBLING PARTS OF A DEVICE SUCH AS A WIEN FILTER

FIELD OF THE INVENTION

The present invention is directed to the structure and mode of operation of a fixture for assembling parts of an instrument such as a Wien filter with an exceptionally high degree of dimensional precision and reliability.

BACKGROUND OF THE INVENTION

Various instruments are known which rely on emission of charged particles from a sample to derive characteristics of the sample. Examples of such instruments are electron microscopes (e.g., scanning electron microscopes), focused ion beam microscopes, and mass spectrometers which utilize various well known means to analyze the charged particles emitted from the sample.

These instruments generally comprise a supporting structure to which active elements such as electrostatic or magnetic pole pieces are adapted to be mounted and secured with a high degree of positional and dimensional precision since the location of those pole pieces controls the detailed nature of the electrostatic or magnetic field that they produce, and because the precision of the instrument is closely dependent on the precision of that electrostatic or magnetic field.

For facilitating the description of the present invention, it will be explained in connection with a scanning electron microscope ("SEM"). However, it should be understood that the invention is not limited to an SEM and can be applied by one with ordinary skill in the art to other instruments such as those mentioned above.

An SEM operates by generating a primary scanning electron beam that impacts a sample a surface of which is being imaged. As a result, backscattered and secondary electrons are emitted from the sample surface and have respective trajectories backward along the original beam direction which is perpendicular to the sample surface (known as the on-axis direction) and at angles diverging therefrom. Emitted electrons are collected by a detector, which is arranged above the sample. The detector generates a signal from the electron emission collected from the sample surface as it is exposed to the electron beam. The signal from the detector is typically processed to create an image of the surface, which is then displayed on a video screen.

With structures such as high aspect-ratio trenches and contact holes, the only electrons able to escape are those emitted on-axis. However, standard SEMs do not readily detect on-axis emitted electrons. This is because the detector must be spaced from the axis so as not to impede the primary, or incident, beam. In that position, on-axis electrons do not impinge upon the detector. Also, the high voltage on the front surface of the detector, which is commonly used to attract the secondary electrons, may adversely affect the primary beam.

The term "filter" as used.herein refers to devices used to in some way separate, or disperse, the particles of a charged particle beam through their inherent differences in either velocity (although often, in fact usually, this quantity is classified as "energy"), charge, or mass. This can be done through application of either electric or magnetic fields, or a combination of both.

Wien filters have long been known (see W. Wien, *Ann. Phys.* 65 (1898), page 444). In such a filter, electrodes and magnetic poles are simultaneously utilized to create both an electric field and a magnetic field. The two fields are tuned, or adjusted, to apply equal and opposite forces to electrons in the incident beam, so that it is not deflected. However, an electron moving in the direction opposite to the incident beam will be oppositely affected by that same magnetic field force, which acts on such electron in the same direction as the electric field force. Thus, that electron will be deflected away from the beam axis. In that way, even the on-axis particles can be detected as they are deflected to a properly positioned detector.

U.S. Pat. No. 4,658,136 of Apr. 14, 1987, entitled "Secondary Electronic Detecting Apparatus" suggests the use of a Wien filter in a scanning electron microscope, but in practice Wien filters have not been used in that application because they have caused relatively small but significant disturbances in the electrostatic and magnetic fields through which the particles of the primary beam and the emitted particles pass, thereby disturbing the trajectories of such particles, which disturbances have been sufficient to undesirably degrade the primary beam and hence the resolution of the SEM. More specifically, the use of a Wien filter in an SEM requires that the magnetic and electrostatic fields be precisely matched and uniform in order to ensure that the primary electron beam is unperturbed and aberrations are kept to a minimum.

In a co-pending patent application entitled "Wien Filter For Use In A Scanning Electron Microscope Or The Like", Ser. No. 10/010,321 filed on Nov. 8, 2001, and assigned to the assignee of this application, and hereby incorporated herein by reference, a particularly improved Wien filter structure is disclosed and claimed. It comprises, broadly considered, a ceramic supporting structure through which a plurality of magnetic pole pieces extend, the pole pieces engaging that supporting structure and being brazed thereto. It is essential to the precision of the functioning of the filter that the location of the pole pieces be controlled to a very high degree of accuracy. That accuracy may be achieved in part by precise machining of the pole pieces and supporting structure, particularly those surfaces of those elements which are pressed into engagement with one another. However, it has been found that that degree of mechanical precision is often incapable of producing sufficient accuracy of operation, particularly when the pole pieces are secured to the supporting structure by brazing, which involves subjecting the parts to very high temperatures over an extended period of time. Inaccuracies in positioning of the pole pieces often tend to occur because of temperature- or heat-related causes.

SUMMARY OF THE INVENTION

One object of the present invention is to provide a fixture for use in assembling pole pieces to a supporting structure, particularly in a Wien filter or the like, which facilitates and ensures the relative positioning of the parts, particularly when they are secured together by a brazing operation, with a significantly improved degree of accuracy and reliability, thereby to produce an instrument of high accuracy and precision.

It is a further object of the present invention to provide such a fixture which supports and guides the parts to be assembled and urges them into engagement with one another during the securing process by means which is substantially not adversely affected by the securing process itself.

It is a more specific object of the present invention to provide such a fixture in which the parts to be assembled are mounted and in which those parts, during the securing operation, are urged against one another by a gravity-actuated means.

As indicated above, while the fixture of the present invention is here specifically described for use in assembling pole pieces to a supporting structure specifically in connection with a scanning electron microscope, it will be understood that the utility of the fixture under discussion is not limited to that application, but is also advantageous in connection with other instruments where a high degree of precision is called for.

The fixture in accordance with one aspect of the present invention comprises a housing into which the supporting structure and associated pole pieces of the instrument are adapted to be received and positioned in a preliminarily assembled relationship. More specifically, the fixture comprises an open-top housing into which the supporting ring of a Wien filter may be placed and supported with its magnetic pole pieces in place, those pole pieces passing through openings in the ring structure and extending radially outwardly to define sections on which energizing coils may be mounted. The supporting ring is provided with outwardly facing surfaces and the pole pieces are provided with inwardly facing pole surfaces adapted to mate with one another and, when the parts are to be connected by brazing, with a thin layer of brazing material interposed between those surfaces. During the brazing operation, which is carried out for an extensive period of time at a highly elevated temperature, all of the parts are subjected to that heat condition. It is therefore necessary that the pole pieces be pressed against the supporting ring during the securing operation. The ultimate relative position of the pole pieces in the completed instrument determines the accuracy and, in a Wien filter, the resolution of the instrument, and that in turn will depend upon the degree and constancy to which the pole pieces are individually pressed against the supporting ring.

By utilizing a series of pole-piece-pushing elements spaced around the fixture so that each acts upon a different pole piece, and by providing for each such element a pole-push-producing instrumentality which is gravity-actuated, the desired degree of accuracy and reproducibility is obtained.

Another aspect of the present invention is directed to a fixture for assembling to a supporting structure a plurality of pieces adapted to be accurately located on and secured to the supporting structure. The fixture includes a body defining a space into which the supporting structure and the pieces are adapted to be received and located. The body includes an outer structure adapted to extend beyond outer ends of the pieces. A plurality of movable elements are mounted on the outer structure for movement in a piece-pushing direction and adapted to respectively engage the outer ends of the pieces in the course of such movement. Gravity-actuated means act on the movable elements to urge them in the piece-pushing direction for engagement with the pieces to thereby push the pieces toward and into operative engagement with the supporting structure.

A further aspect of the present invention is directed to a fixture for assembling to a supporting structure a plurality of pole pieces adapted to be spaced along and secured to the supporting structure. The fixture includes a bottom wall and a second wall extending up from the bottom wall to define an open-topped interior space into which the supporting structure and the pole pieces are adapted to be received. A series of openings in the second wall are provided so that each corresponds in location to one of the pole pieces. Arms are mounted in the openings. These arms have a first part extending radially inwardly of the second wall and adapted to engage a pole piece and urge it toward the supporting structure, and a second part extending generally outwardly of the second wall. A weight-means is operably connected to the second part and is effective to urge the second part so as to move the first part against the corresponding pole piece and urge the pole piece against the supporting structure.

Still another aspect of the present invention is directed to a method for assembling an apparatus including a supporting structure to which a plurality of pieces are to brazed. A fixture is provided having a body defining a space into which the supporting structure and the pieces are adapted to be received and located. The body includes an outer structure adapted to extend beyond outer ends of the pieces. The supporting structure and pieces are preliminarily positioned relative to each other within the space so that opposed surfaces on the supporting structure and the respective pieces are in mating engagement. A plurality of movable elements are mounted on the outer structure for movement in a piece-pushing direction and adapted to respectively engage the outer ends of the pieces in the course of such movement. A gravity-actuated means acting on the movable elements urges them in the piece-pushing direction for engagement with the pieces to thereby push the pieces to attain the mating engagement with the supporting structure. Then, the supporting structure and pieces are brazed to each other.

BRIEF DESCRIPTION OF THE DRAWINGS

To the accomplishment of the above, and to such other objects as may hereinafter appear, the present invention relates to the construction of a fixture for assembling Wien filter pole pieces or the like to their supporting structure with a high degree of accuracy and reliability, as defined in the appended claims and as described in this specification, taken together with the accompanying drawings, in which:

FIG. 2 is a view of a fixture similar to the view shown in FIG. 1, but with the parts of a Wien filter in position within the fixture.

DETAILED DESCRIPTION OF THE DRAWINGS

Figure 1:
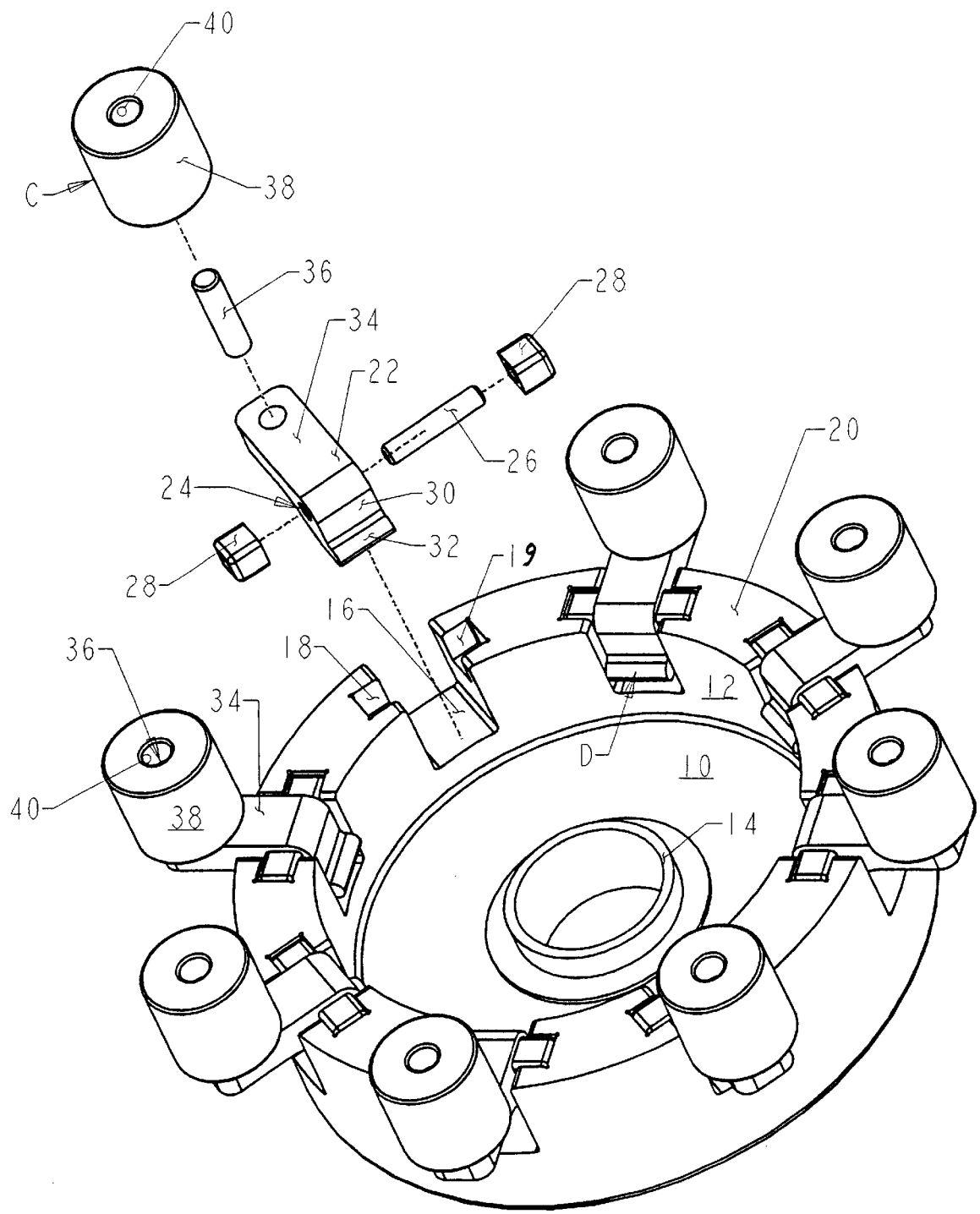
FIG. 1 is a perspective view, taken from above, of the fixture of the present invention, with one of the pole-piece-pushing structures being shown in exploded condition.

The Wien filter structure which is used herein to illustrate the applicability and utility of the fixture of the present invention comprises is disclosed in more detail in patent application Ser. No. 10/010,321 referred to above. Such structure is also shown in FIG. 2 hereof, and it includes a supporting structure generally designated A which is in the form of a ring. The ring is preferably formed of a suitable ceramic material on which eight magnetic pole pieces generally designated B are mounted in uniformly circumferentially-spaced relationship. Those pole pieces B extend through apertures, or openings, formed in the ring A so that parts 2 of pole pieces B extend radially inwardly from the ring A to terminate in pole faces 4, while other parts 6 of the pole pieces B extend radially outwardly from the ring A and support energizing electric coils (not shown). Those outwardly extending pole parts 6 have enlarged parts 8 which are adapted to be pressed against and secured to the ring A.

The assembly of pole pieces B with ring A is preferably accomplished by brazing the facing and mating surfaces of the ring A and the pole piece parts 8 to one another. As is well known to those familiar with the art, a typical brazing process begins with the metallization of the mating surfaces of the ceramic ring A. This may be achieved by painting or screen printing a molybdenum-manganese slurry onto the ceramic surface and firing the part, followed by a copper strike and nickel plating. Then the brazing alloy (a copper-silver eutectic may be used for this purpose) is either painted onto one or both of the surfaces to be brazed together or a thin pre-formed foil of the brazing alloy is placed between the surfaces to be brazed. Then, while those surfaces are pressed against one another, the assembly is subjected to a high temperature, usually in an inert gas atmosphere, for an extended period of time, after which the parts remain reliably secured to one another.

The precision with which final positioning of each of the pole pieces B relative to the ring A is achieved is, to a large extent, dependent upon the reliability and constancy of the degree to which the pole pieces are pressed against the supporting ring A while the brazing operation takes place. Unless the forces exerted on each of the pole pieces B are the same throughout that brazing operation, and can be reliably repeated from one instrument to the next, the precise location of the pole pieces B with respect to the supporting ring A, and hence the precise relative location of the pole faces 4, may not be uniform from one instrument to the next or, indeed, may not be uniform in a particular instrument. Without that uniformity, magnetic fields will be produced which are not sufficiently precise and reproducible, thereby adversely affecting the functioning of the instrument and, in particular, its resolution. This positional problem is particularly acute when the brazing alloy is provided in the form of foil whose compressibility will vary to an appreciable degree depending upon the force with which a given pole piece B is urged toward the ceramic ring A, thereby affecting the ultimate positioning of the pole pieces B.

Because of the high temperatures involved in the brazing operation, approximating 850° C. in a typical process, the use of an ostensibly rigid mechanical clamp to hold the pole pieces in place is not practical, both because it is difficult for such a device to ensure that each pole piece is pressed inwardly with the same force but also because expansion of the parts when heated may give rise to positional variations of sufficient magnitude as to be undesirable. Use of spring clamps to urge the pole pieces B against the ceramic ring A are also undesirable because the temperature conditions involved in the brazing operation would tend to anneal those clamps and change their characteristics in ways and to degrees which would be hard to control with sufficient accuracy.

The fixture of the present invention avoids those drawbacks by having parts active on the individual pole pieces B to push them radially inwardly by means of a force which is gravity-produced and, thus, is independent of and essentially unaffected by the brazing conditions. That is accomplished by providing a plurality of weights generally designated C which are mounted so as to be freely moveable downwardly under the influence of gravity. Those weights cause parts generally designated D to engage the outer ends of the pole pieces B and push those pole pieces radially inwardly with a predetermined and constant force while the brazing operation takes place.

More specifically, the fixture comprises a body defined by a bottom wall 10 from which a ring-shaped wall 12 extends upwardly to produce an open-topped space sized to receive the supporting ring A in which the pole pieces B have been positioned. The bottom wall 10 may be provided with an upstanding ring 14, located inwardly of and concentric with wall 12, to internally engage a downwardly extending portion of the ceramic ring A and thus locate the filter parts appropriately within the fixture.

The upstanding wall 12 is provided with a series of radially-directed, open-top notches 16, each notch corresponding to one of the pole pieces B, evenly spaced about the ring-shaped wall 12. The upper surfaces of the wall 12 are provided with circumferentially directed, facing recess pairs 18, 19 extending downwardly from the top surface 20 of the wall 12 at both sides of each of the notches 16.

Each notch 16 freely receives therein an arm 22 provided with a lateral passage 24 through which a shaft 26 extends. Bushings 28 are mounted on those portions of the shaft 26 which extend out laterally from the arm 22. The bushings 28 are sized to be securely yet removably received in the recesses 18 to thereby, with the shaft 26 therebetween, pivotally mount the arm 22 on the wall 12.

Part D of arm 22 includes a radially inner part 30 terminating in an end 32 which is adapted to bear against the radially outermost surface of a pole piece B. The arm 22 also has a radially outwardly extending part 34 which extends beyond the wall 12 and is there provided with an upwardly extending pin 36 secured thereto.

The weights C are shown in the form of cylinders 38 with a central aperture 40 into which the pins 36 are adapted to be received, so that the weights C are removably mounted on the arms 22. That removability is desired in order to permit the weights C to be changed from one use to another in order to adapt the fixture for use with specifically different filters, or in order to modify the functioning of the fixture in connection with a given filter design, for example on a trial and error basis. However, the weights C, whether readily removable and replaceable or not, are acted upon by gravity and thus act to pivot the arms 22 about the shaft 26 and press the pole pieces B engaged by the arm parts 32 radially inwardly into engagement with the ceramic supporting ring A. The pressing force can readily be changed by the choice of the weight C. However, whichever pressing force is selected by virtue of choosing a weight C, in accordance with a particularly advantageous aspect of the present invention, that force will be uniformly and reliably exerted on the pole pieces B throughout the brazing operation and without being adversely affected by the temperatures involved.

Thus, through the use of the fixture disclosed above, Wien filters or the like may have their parts assembled to produce electrostatic and magnetic fields that are precisely of the character and uniformity desired, with great reliability and repeatability from one instrument of a given type to another of the same type. The fixture is readily adaptable for use in making operationally different instruments simply by substituting weights. This advance in precision is accomplished by a sturdy structure itself not particularly precise in design or expensive to construct, but which is nevertheless exceedingly effective in producing instruments of great accuracy.

Although the detailed description provided above discusses specific embodiments of the present invention, various modifications thereto will be readily apparent to anyone with ordinary skill in the art. All such modifications are intended to fall within the scope of the present invention as defined by the following claims.

We claim:

1. A fixture for assembling to a supporting structure a plurality of pieces adapted to be accurately located on and secured to said supporting structure, said fixture comprising:

a body defining a space into which the supporting structure and the pieces are adapted to be received and located, said body including an outer structure adapted to extend beyond outer ends of said pieces;

a plurality of movable elements mounted on said outer structure for movement in a piece-pushing direction and adapted to respectively engage the outer ends of the pieces in the course of such movement; and gravity-actuated means acting on said movable elements to urge them in said piece-pushing direction for engagement with said pieces to thereby push said pieces toward and into operative engagement with said supporting structure.

2. The fixture of claim 1, wherein said space-defining body comprises a bottom portion from which said outer structure extends upwardly.

3. The fixture of claim 2, said outer structure defining an open-top interior space into which said supporting structure and said pieces are adapted to be received, said movable elements being mounted on said outer structure to move generally radially of said space.

4. The fixture of claim 3, wherein said gravity-activated means comprises a plurality of parts articulately mounted on said outer structure which each carry a weight at a first portion thereof and one of said movable elements at a second portion thereof.

5. The fixture of claim 4, wherein said articulately mounted parts are mounted so as to essentially pivot about a horizontal axis, said first and second portions of said parts extending, respectively, generally radially outwardly and inwardly from said axis.

6. The fixture of claim 4, wherein said outer structure is a wall.

7. A fixture for assembling to a supporting structure a plurality of pole pieces adapted to be spaced along and secured to said supporting structure, said fixture comprising:

a bottom wall;

a second wall extending up from said bottom wall to define an open-topped interior space into which said supporting structure and said pole pieces are adapted to be received;

a series of openings in said second wall, each corresponding in location to a corresponding one of said pole pieces;

arms mounted in said openings, said arms having a first part extending radially inwardly of said second wall and adapted to engage a pole piece and urge it toward said supporting structure, and a second part extending generally outwardly of said second wall; and weight-means operably connected to said second part and effective to urge said second part so as to move said first part against the corresponding pole piece and urge the pole piece against said supporting structure.

8. The fixture of claim 7, wherein said arms are pivoted about a horizontal axis located in said opening.

9. The fixture of claim 8, wherein said weight means is operably connected to said second part radially outwardly of said second wall.

10. The fixture of claim 7, wherein said second part comprises a weight mounting means, said weight means being removably mounted on said weight mounting means.

11. A method for assembling an apparatus including a supporting structure to which a plurality of pieces are to brazed, comprising:

providing a fixture having a body defining a space into which the supporting structure and the pieces are adapted to be received and located, said body including an outer structure adapted to extend beyond outer ends of said pieces;

positioning the supporting structure and pieces preliminarily relative to each other within said space so that opposed surfaces on the supporting structure and the respective pieces are in mating engagement;

providing a plurality of movable elements mounted on said outer structure for movement in a piece-pushing direction and adapted to respectively engage the outer ends of the pieces in the course of such movement;

providing gravity-actuated means acting on said movable elements to urge them in said piece-pushing direction for engagement with said pieces to thereby push said pieces to attain said mating engagement with said supporting structure; and brazing the supporting structure and pieces to each other.

* * * * *